(12) United States Patent
Tucker

(10) Patent No.: US 11,050,204 B2
(45) Date of Patent: Jun. 29, 2021

(54) CAMERA CONTROL UNIT (CCU) COMMUNICATIONS BREAKOUT BOX

(71) Applicant: The University of North Carolina at Chapel Hill, Chapel Hill, NC (US)

(72) Inventor: Kevin Gerard Tucker, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 0 days.

(21) Appl. No.: 16/513,610

(22) Filed: Jul. 16, 2019

(65) Prior Publication Data

US 2020/0021073 A1 Jan. 16, 2020

Related U.S. Application Data

(60) Provisional application No. 62/698,858, filed on Jul. 16, 2018.

(51) Int. Cl.
*H01R 33/90* (2006.01)
*H05K 5/00* (2006.01)
*H05K 7/14* (2006.01)

(52) U.S. Cl.
CPC ........... *H01R 33/90* (2013.01); *H05K 5/0017* (2013.01); *H05K 5/0026* (2013.01); *H05K 7/1427* (2013.01)

(58) Field of Classification Search
CPC .... H01R 33/90; H05K 5/0017; H05K 5/0026; H05K 7/1427
See application file for complete search history.

(56) References Cited

U.S. PATENT DOCUMENTS

| | | | | |
|---|---|---|---|---|
| 4,762,388 A | * | 8/1988 | Tanaka | G02B 6/3878 385/58 |
| 5,027,792 A | * | 7/1991 | Meyer | A61B 17/32002 600/104 |

(Continued)

OTHER PUBLICATIONS

"SA&J DB25M-43XM/33XF 4-Wire Intercom & Tally Breakout Cable for Select Sony & Panasonic CCU's",TheBroadcastshop.com, https://www.thebroadcastshop.com/item/?i=7677%2D%2Dsaj%2Ddb25m%2D43xm%2D33xf%2Dxx%2Dsony%2Dccu%2D4%2Dwire%2Dintercom%2Dtally%2Dcable, pp. 1-3 (downloaded May 3, 2018).

(Continued)

*Primary Examiner* — Harshad C Patel
(74) *Attorney, Agent, or Firm* — Jenkins, Wilson, Taylor & Hunt, P.A.

(57) ABSTRACT

According to one aspect, the subject matter described herein includes a camera control unit (CCU) communications breakout box. The CCU communications breakout box includes a housing for mounting to an audio/visual equipment rack, the housing including a first surface having signal connector apertures. The CCU communications breakout box further includes a plurality of signal connectors mounted in the signal connector apertures, the signal connectors including a multi-conductor CCU connector having a plurality of conductors that are connectable to a CCU via a multi-conductor cable, the signal connectors further including CCU signal breakout connectors connected to predetermined ones of the conductors of the multi-conductor CCU connector for breaking out signals of the CCU accessible through the multi-conductor CCU connector.

3 Claims, 11 Drawing Sheets

(56) References Cited

U.S. PATENT DOCUMENTS

| | | | | |
|---|---|---|---|---|
| 5,703,754 A | * | 12/1997 | Hinze | B60R 16/0239 |
| | | | | 361/736 |
| 6,024,607 A | * | 2/2000 | Wahl | H01R 12/716 |
| | | | | 439/639 |
| 6,547,572 B1 | * | 4/2003 | Burdick | B60R 16/0238 |
| | | | | 439/76.2 |
| 7,137,823 B2 | * | 11/2006 | Naganishi | H01R 9/2466 |
| | | | | 439/34 |
| 7,484,970 B1 | * | 2/2009 | Chen | H04Q 1/142 |
| | | | | 439/76.1 |
| 7,783,801 B2 | * | 8/2010 | Lin | H01R 27/02 |
| | | | | 710/63 |
| 7,817,398 B1 | * | 10/2010 | Maples | H04Q 1/146 |
| | | | | 361/111 |
| 8,469,736 B2 | * | 6/2013 | Pan | H01R 31/06 |
| | | | | 439/502 |
| 9,437,912 B2 | * | 9/2016 | Song | H01P 1/047 |
| 2002/0182931 A1 | * | 12/2002 | Ortowski | H01R 13/748 |
| | | | | 439/540.1 |
| 2004/0105628 A1 | * | 6/2004 | Morse | G02B 6/30 |
| | | | | 385/89 |
| 2004/0165181 A1 | * | 8/2004 | Kume | G01M 11/088 |
| | | | | 356/237.2 |
| 2005/0106941 A1 | * | 5/2005 | Witchey | H04L 69/08 |
| | | | | 439/620.09 |
| 2008/0111581 A1 | * | 5/2008 | Wong | H03K 19/177 |
| | | | | 326/37 |
| 2008/0113530 A1 | * | 5/2008 | Sakamoto | H01R 13/629 |
| | | | | 439/76.2 |
| 2009/0037008 A1 | * | 2/2009 | Moorer | G06F 1/18 |
| | | | | 700/94 |
| 2011/0081802 A1 | * | 4/2011 | Knepp | H04H 60/04 |
| | | | | 439/540.1 |
| 2011/0135253 A1 | * | 6/2011 | Lin | G02B 6/3845 |
| | | | | 385/74 |
| 2011/0154405 A1 | * | 6/2011 | Isaias | H04N 5/44513 |
| | | | | 725/53 |
| 2012/0021618 A1 | * | 1/2012 | Schultz | H01R 13/719 |
| | | | | 439/38 |
| 2012/0170940 A1 | * | 7/2012 | Hsu | H04B 10/272 |
| | | | | 398/135 |
| 2012/0226408 A1 | * | 9/2012 | Miller | B60R 16/02 |
| | | | | 701/31.5 |
| 2018/0287321 A1 | * | 10/2018 | Nowak | H05K 7/1427 |

OTHER PUBLICATIONS

"Camera Control Unit: CCU-D50, CCU-D50P," Sony, pp. 1-32 (2002).

* cited by examiner

— RECEPTACLE —

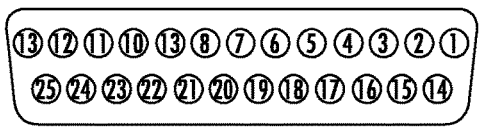

INSERTION SIDE

BS SIDE : [METRIC] 17LE-13250-27{D3AB}-FA
[METRIC] 17LE-13250-27{D3AB}-FA
CABLE SIDE : DB-25PF-N OR EQUIVALENT

| PIN NO. | NAME | FUCTION | I/O | EXTERNAL INTERFACE 4 WIRE | RTS / CLEAR-COM |
|---|---|---|---|---|---|
| 1 | ENG B-S(H) | ENG CH INTERCOM OUTPUT TO THE SYST FROM THE CCU/BS (H) | OUT | 1 | 1 — 3 AUDIO |
| 2 | ENG B-S(C) | ENG CH INTERCOM OUTPUT TO THE SYST FROM THE CCU/BS (C) | OUT | 2 | 2 DC |
| 3 | ENG (S) | ENG CH INTERCOM SHIELD | | 3 | 3 — 1 GND |
| 4 | ENG S-B(H) | ENG CH INTERCOM INPUT TO THE CCU/BS FROM THE SYSTEM (H) | IN | 4 | |
| 5 | ENG B-S(C) | ENG CH INTERCOM INPUT TO THE CCU/BS FROM THE SYSTEM (C) | IN | 5 | |
| 6 | PGM-1(H) | PROGRAM AUDIO CHANNEL-1 INPUT (H) | IN | 6 | |
| 7 | PGM-1(C) | PROGRAM AUDIO CHANNEL-1 INPUT (C) | IN | 7 | |
| 8 | PGM-1(S) | PROGRAM AUDIO CHANNEL-1 SHIELD | | 8 | |
| 9 | GND | GROUND | GND | 9 | |
| 10 | Y TALLY IN | YELLOW TALLY INPUT (+) | IN | 10 —/o— MAKE | |
| 11 | R TALLY IN | RED TALLY INPUT (+) | IN | 11 —/o— MAKE | |
| 12 | R TALLY COMM | RED TALLY COMMON | | 12 | |
| 13 | GND | GROUND | GND | 13 | |
| 14 | PROD B-S(H) | PROD CH INTERCOM OUTPUT TO THE SYSTEM FROM THE CCU/BS (H) | OUT | 14 | 14 — 3 AUDIO |
| 15 | PROD B-S(H) | PROD CH INTERCOM OUTPUT TO THE SYSTEM FROM THE CCU/BS (C) | OUT | 15 | 2 DC |
| 16 | PROD(S) | PROD CH INTERCOM SHIELD | | 16 | 16 — 1 GND |
| 17 | PROD S-B(H) | PROD CH INTERCOM INPUT TO THE CCU/BS SYSTEM FROM THE (H) | IN | 17 | |
| 18 | PROD S-B(C) | PROD CH INTERCOM INPUT TO THE CCU/BS SYSTEM FROM THE (C) | IN | 18 | |
| 19 | PGM-2 (H) | PROGRAM AUDIO CHANNEL-2 INPUT (H) | IN | 19 | |
| 20 | PGM-2 (C) | PROGRAM AUDIO CHANNEL-2 INPUT (C) | IN | 20 | |
| 21 | PGM-2 (S) | PROGRAM AUDIO CHANNEL-2 SHIELD | | 21 | |
| 22 | PGM-3 (G) | PROGRAM AUDIO CHANNEL-3 INPUT (H) | IN | 22 | |
| 23 | PGM-3 (C) | PROGRAM AUDIO CHANNEL-3 INPUT (C) | IN | 23 | |
| 24 | G TALLY IN | GREEN TALLY INPUT(+) | IN | 24 —/o— MAKE | |
| 25 | G TALLY COMM | GREEN TALLY COMMON | | 25 | |

CAMERA CONTROL UNIT (CCU) COMMUNICATIONS BREAKOUT BOX

PRIORITY CLAIM

This application claims the benefit of U.S. Provisional Patent Application No. 62/698,858 filed Jul. 16, 2018, the disclosure of which is incorporated herein by reference in its entirety.

TECHNICAL FIELD

The subject matter described herein relates to communications between a camera and a camera control unit. More particularly, the subject matter described herein relates to a camera control unit communications breakout box.

BACKGROUND

In broadcast video technology, a camera control unit is an electronic device, usually in the form of a rack-mounted box, that connects to a video camera and to external video recording, display, and control devices. FIG. 1 is a block diagram illustrating connections between a Sony D50/D50P camera control unit, a video camera, and various other external control and monitoring devices. One of the connections in the camera control unit illustrated in FIG. 1 is the intercom/tally/aux connector 100, which connects the CCU to external intercom, program voice, and tally systems. In the illustrated example, the intercom/tally/aux connector is a 15-pin connector with pins that correspond to various signals for the intercom, program voice, and tally systems. Tally systems are systems that control on air indicator lights displayed on video cameras.

One problem with the intercom/tally/aux connector provided on the camera control unit is that many external intercom, program voice, and tally systems require other types of connectors, such as XLR connectors to exchange signals with the CCU. One conventional solution for connecting to these external systems is to create adapter connectors by soldering wires to the pins of the intercom/tally/aux connector and soldering the wires to various conductors on external connectors. However, such adapters, whether manually created or even if purchased off the shelf are cumbersome and unwieldy to use. FIG. 2 illustrates an example of one commercially available DB25 to XLR adapter. DB25 is a 25-pin connector that connects to the intercom/tally/aux connector on some CCUs. As can be seen in FIG. 2, the DB25 to XLR adapter is an unwieldy bunch of cables that make it difficult to determine which signal is being carried and are likely to be misconnected. Accordingly, there exists the need for an improved method for breaking out the signals from a multi-conductor CCU connector of a camera control unit.

SUMMARY

According to one aspect, the subject matter described herein includes a camera control unit (CCU) communications breakout box. The CCU communications breakout box includes a housing for mounting to an audio/visual equipment rack, the housing including a first surface having signal connector apertures. The CCU communications breakout box further includes a plurality of signal connectors mounted in the signal connector apertures, the signal connectors including a multi-conductor CCU connector having a plurality of conductors that are connectable to a CCU via a multi-conductor cable, the signal connectors further including CCU signal breakout connectors connected to predetermined ones of the conductors of the multi-conductor CCU connector for breaking out signals of the CCU accessible through the multi-conductor CCU connector.

According to another aspect of the subject matter described herein, the housing includes a second surface opposite the first surface for connecting to the audio/visual equipment rack.

According to yet another aspect of the subject matter described herein, the multi-conductor CCU connector comprises a DB25 connector.

According to yet another aspect of the subject matter described herein, the CCU signal breakout connectors include XLR connectors.

According to yet another aspect of the subject matter described herein, the XLR connectors connect to program conductors of the multi-conductor CCU connector.

According to yet another aspect of the subject matter described herein, the signal connectors include optical fiber connectors for connecting to a camera.

According to yet another aspect of the subject matter described herein, the CCU signal breakout connectors include Ethernet connectors.

According to yet another aspect of the subject matter described herein, the Ethernet connectors connect to intercom conductors of the multi-conductor CCU connector.

According to yet another aspect of the subject matter described herein the CCU signal breakout connectors include tally connectors that connect to tally conductors of the multi-conductor CCU connector.

According to yet another aspect of the subject matter described herein, the CCU communications breakout box includes a plurality of wires, wherein the plurality of signal connectors are connected to the conductors of the multi-conductor CCU connector through the wires.

According to yet another aspect of the subject matter described herein, the CCU communications breakout box includes a printed circuit board, wherein the plurality of signal connectors and the multi-conductor CCU connector are mounted on the printed circuit board and the conductors of the multi-conductor CCU connector are connected to the signal connectors via traces on the printed circuit board.

According to another aspect of the subject matter described herein, the printed circuit board includes ground connectors for grounding predetermined signals pins of the multi-conductor CCU connector via resistors.

According to another aspect of the subject matter described herein, a camera control unit (CCU) communications breakout box includes a housing. The CCU communications breakout box further includes a printed circuit board located within the housing. The CCU communication breakout box further includes a multi-conductor CCU connector connected to the printed circuit board for connecting to a CCU. The CCU communications breakout box further includes a plurality of CCU signal breakout connectors electrically connected to predetermined signal pins of the multi-conductor CCU connector for breaking out CCU signals.

According to yet another aspect of the subject matter described herein, the housing completely encloses electrical connections between the multi-conductor CCU connector and the CCU signal breakout connectors.

According to yet another aspect of the subject matter described herein, the CCU communications breakout box includes a plurality of conductive traces on the printed circuit board, and the CCU signal breakout connectors are connected to the predetermined signal pins of the CCU connectors via the conductive traces.

According to yet another aspect of the subject matter described herein, the multi-conductor CCU connector and the signal breakout connectors are soldered to the printed circuit board using pin through hole solder connections.

According to yet another aspect of the subject matter described herein, a camera control unit (CCU) communications breakout box includes a housing for mechanically connecting to an audio/visual equipment rack. The CCU communications breakout box further includes a printed circuit board located in the housing. The CCU communications breakout box further includes a multi-conductor CCU connector mounted to the printed circuit board for connecting to a CCU. The CCU communications breakout box further includes first and second XLR connectors mounted to the printed circuit board and electrically connected to XLR pins of the multi-conductor connector for breaking out audio signals. The CCU communications breakout box further includes first and second communications connectors mounted to the printed circuit board and electrically connected to communications pins of the multi-conductor CCU connector. The CCU communications breakout box further includes a tally connector mounted to the printed circuit board and electrically connected to a tally signal pin of the multi-conductor CCU connector. The CCU communications breakout box further includes a plurality of conductive traces printed on the printed circuit board and connecting the first and second XLR connectors to the XLR pins of the multi-conductor CCU connector, the first and second communications connectors to the communications pins of the multi-conductor CCU connector, and the tally connector to the tally signal pin of the multi-conductor CCU connector.

According to another aspect of the subject matter described herein, the CCU communications breakout box further includes a plurality of ground connections comprising a first via connected to one of the signal pins of the multi-conductor CCU connector and a second via connected to a ground plane of the printed circuit board, wherein the first and second vias are spaced from each other to allow a resistor to be connected between the first and second vias.

According to yet another aspect of the subject matter described herein, the housing is configured to break out signals from a single CCU.

According to yet another aspect of the subject matter described herein, the housing is configured to break out signals from a plurality of CCUs.

BRIEF DESCRIPTION OF THE DRAWINGS

FIG. 3 is a diagram of signal pins of a DB25 connector and a table illustrating the functions of the signal pins;

DETAILED DESCRIPTION

The subject matter described herein includes a CCU communications breakout box that breaks out signals of a multi-conductor CCU connector connectable to a CCU to a plurality of different CCU signal breakout connectors. In one example, the multi-conductor CCU connector that is connectable to the CCU may be a DB25 connector. However, the subject matter described herein is not limited to breaking out signals from a DB25 connector. Breaking out signals from any multi-conductor CCU connector that connects to a CCU is intended to be within the scope of the subject matter described herein.

FIG. 3 is a diagram of signal pins a DB25 receptacle and a table listing the functions of the signals carried by each signal pin. In FIG. 3, there are 25 total signal pins, each of which corresponds to an intercom, tally, program, or other signal. It is these signals that are broken out into breakout signal connectors using the CCU communications breakout box described herein.

Figure 1:
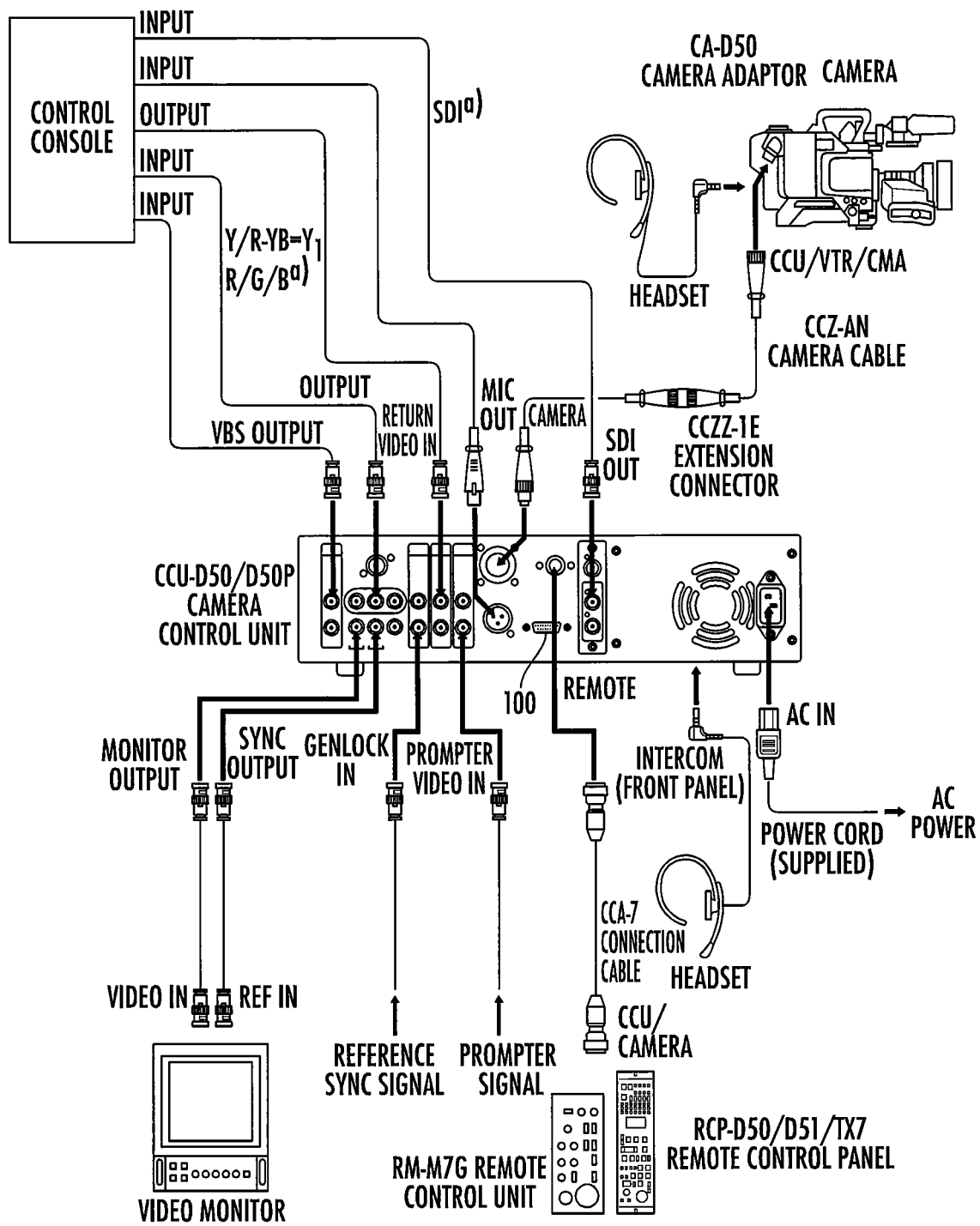
FIG. 1 is a diagram illustrating exemplary connections to a Sony CCU.
Figure 2:
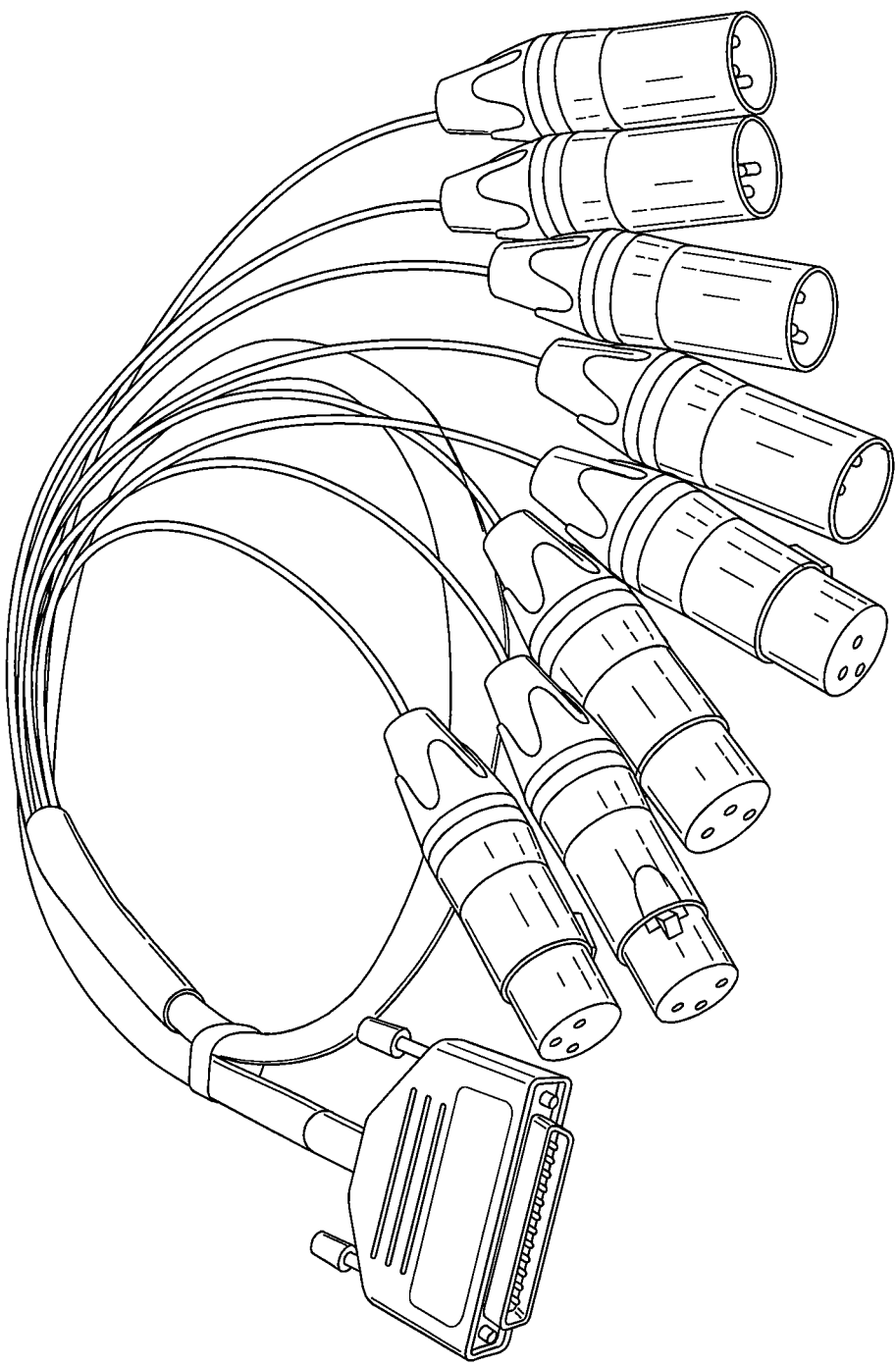
FIG. 2 is a diagram illustrating a conventional DB25 to XLR adapter.
Figure 4:
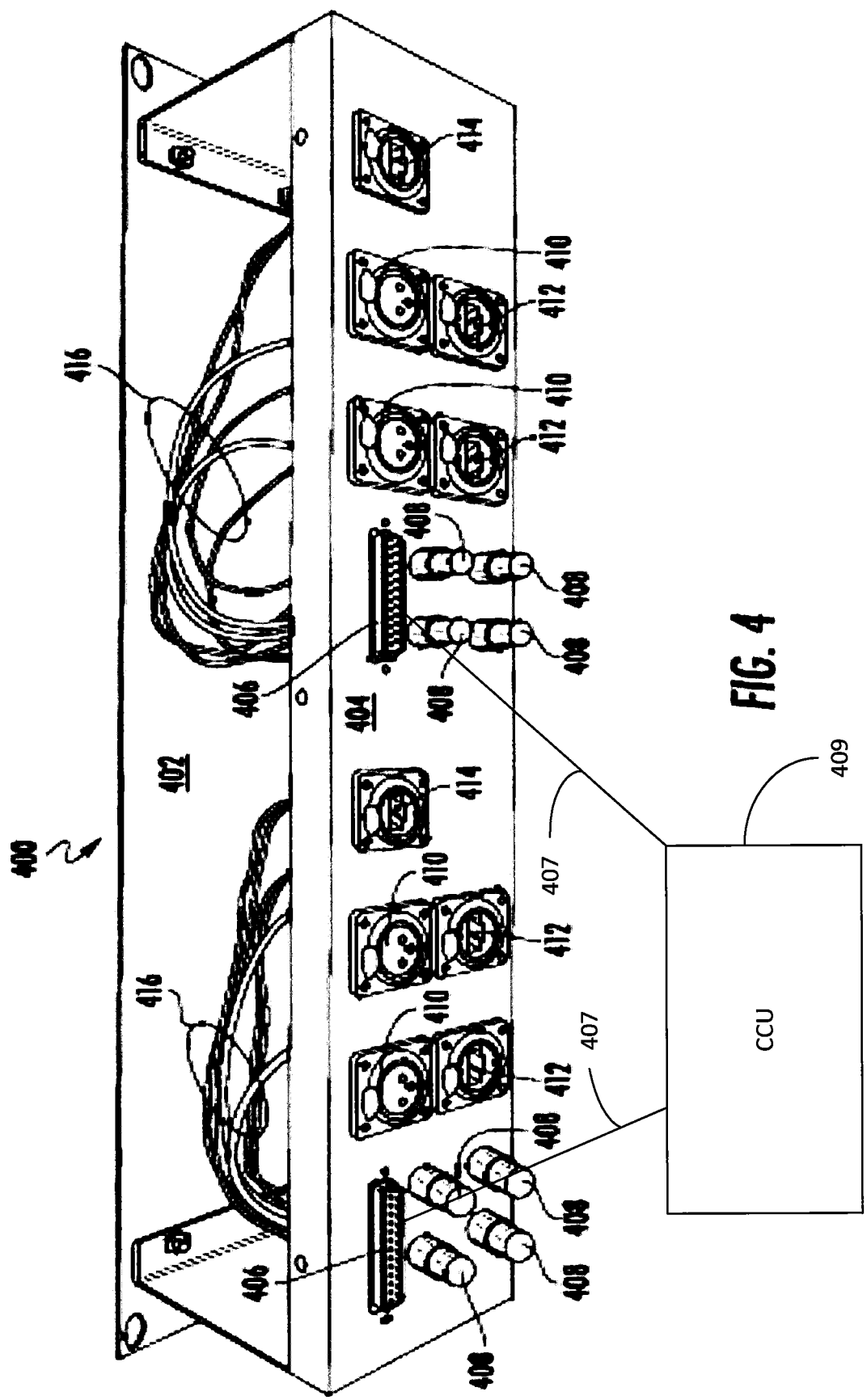
FIG. 4 is a rear perspective view of a CCU communications breakout box.

FIG. 4 illustrates a rear perspective view of a CCU communications breakout box that breaks out the various signals illustrated in FIG. 3. In FIG. 4, the CCU communications breakout box includes a housing 400. Housing 400 includes a first or front surface 402 for mounting to an equipment rack and a second or rear surface 404 including apertures for receiving the various signal connectors. The top of housing 400 is removed in FIG. 4 to allow viewing of the components within housing 400. In the illustrated example, the signal connectors are located in the rear surface. However, in an alternate implementation of the subject matter described herein, the signal connectors could be mounted in front surface 402.

In FIG. 4, the connectors located in surface 404 include female multi-conductor CCU connectors 406, which in the illustrated example are DB25 connectors. Multi-conductor CCU connectors 406 receive corresponding DB25 cables 407, which connect to a CCU 409. The signal connectors located in surface 404 further include fiber optic connectors 408 that connect to fiber optic cables, which connect to a video camera, to receive video signals from the camera. The connectors mounted in surface 404 further include CCU signal breakout connectors, which are electrically connected to one or more of the multi-conductor CCU connectors 406 to break out the signals from the CCU for connection to external audio, video, or control systems. In the illustrated example, the CCU signal breakout connectors include XLR connectors 410, each of which connect to program 1 and program 2 signal conductors of one of multi-conductor CCU connectors 406. The CCU signal breakout connectors further include communication connectors 412, which are Ethernet connectors, which connect to intercom signal conductors of multi-conductor CCU connectors 406. The CCU signal breakout connectors further include tally connectors 414, which connect to tally conductors of multi-conductor CCU connectors 406. In the illustrated example, communications connectors 412 and tally connectors 414 are cat5 connectors, such as EtherCON connectors. An EtherCON connector is an Ethernet over twisted pair connector manufactured by Neutrik of Liechtenstein. In an alternate implementation, communications connectors 412 and tally connectors 414 can be XLR connectors.

All of the wiring between multi-conductor CCU connectors 406 and connectors 410, 412, and 414 is located within housing 400. In the illustrated example, wiring 416 located within housing 400 connects the DB25 signal pins to the various signal connectors located in surface 404 of housing 400.

Figure 5:
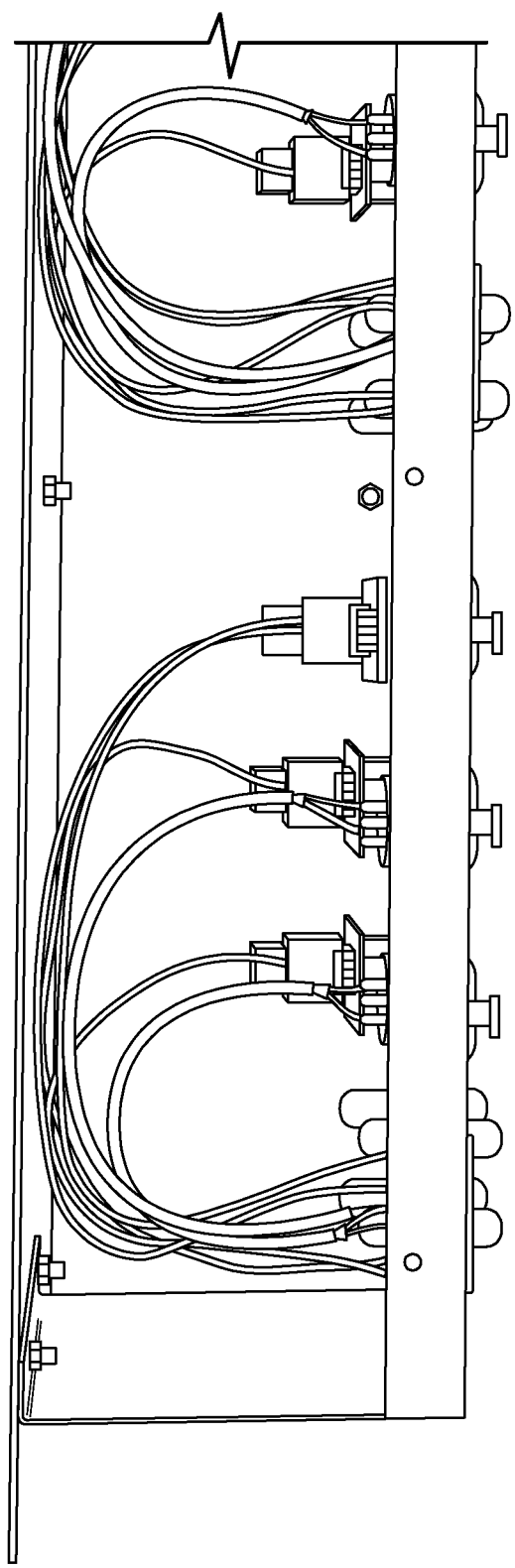
FIG. 5 is a top view of a CCU communications breakout box.

FIG. 5 is a top view of housing 400 illustrating internal wiring connections. In FIG. 5, the internal wiring extends from the DB25 signal pins to printed circuit boards located on the rear side of communication connectors 412 and tally connectors 414 illustrated in FIG. 4. The internal wiring also extends from the DB25 signal pins and is soldered to conductors located on the rear side of XLR connectors 410. The subject matter described herein is not limited to using wires to connect the DB25 signal conductors to the CCU signal breakout connectors. In an alternate implementation, traces on one or more printed circuit boards may be used to connect the breakout connectors to the DB25 signal conductors.

Figure 6:
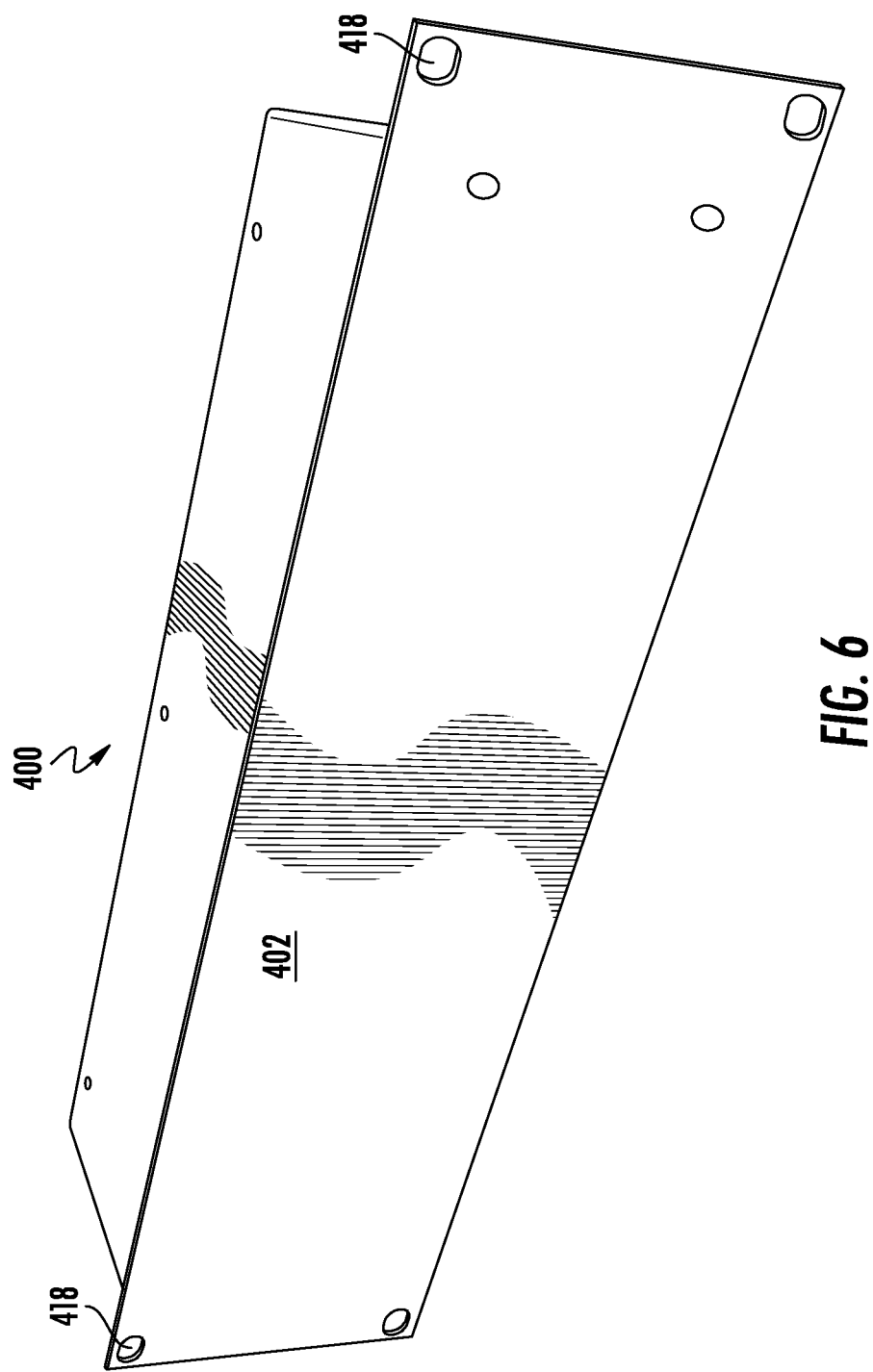
FIG. 6 is a front perspective view of a CCU communications breakout box.

FIG. 6 is a front perspective view of housing 400. In FIG. 6, it can be seen that surface 402 of housing 400 includes mounting holes 418 for connecting with an audio/visual equipment rack using appropriate fasteners, such as bolts or screws. The top of housing 400 is also shown in FIG. 6.

Figure 7A:
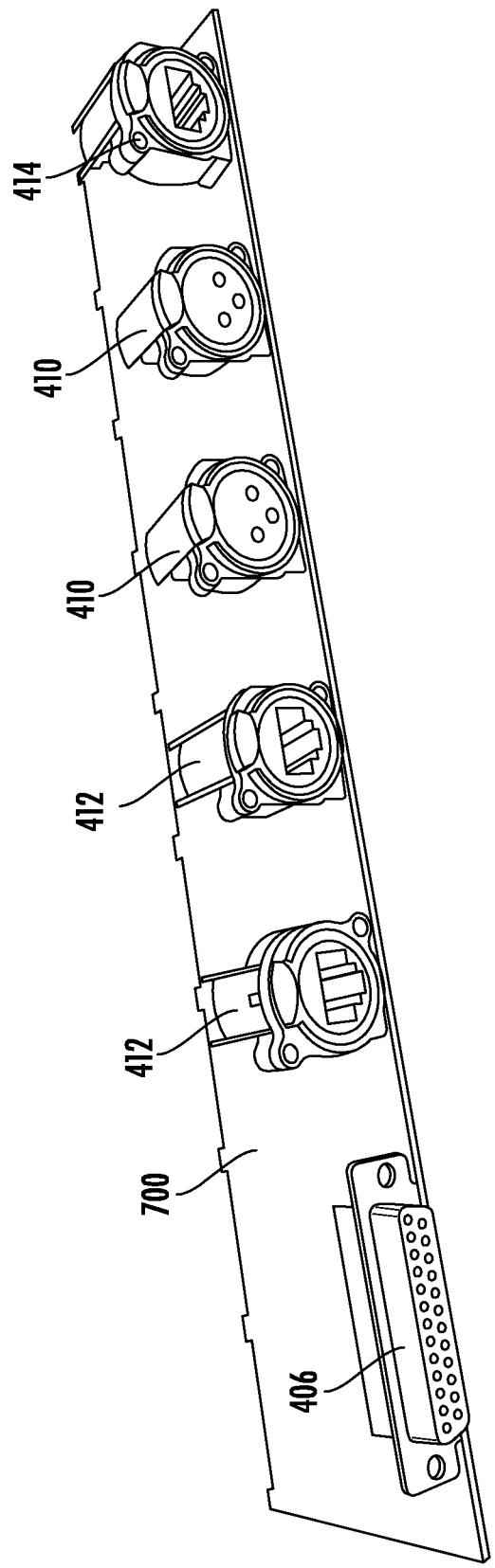
FIG. 7A is a perspective view of an alternate implementation of a printed circuit board with a multi-conductor CCU connector and CCU signal breakout connectors mounted thereon.
Figure 7B:
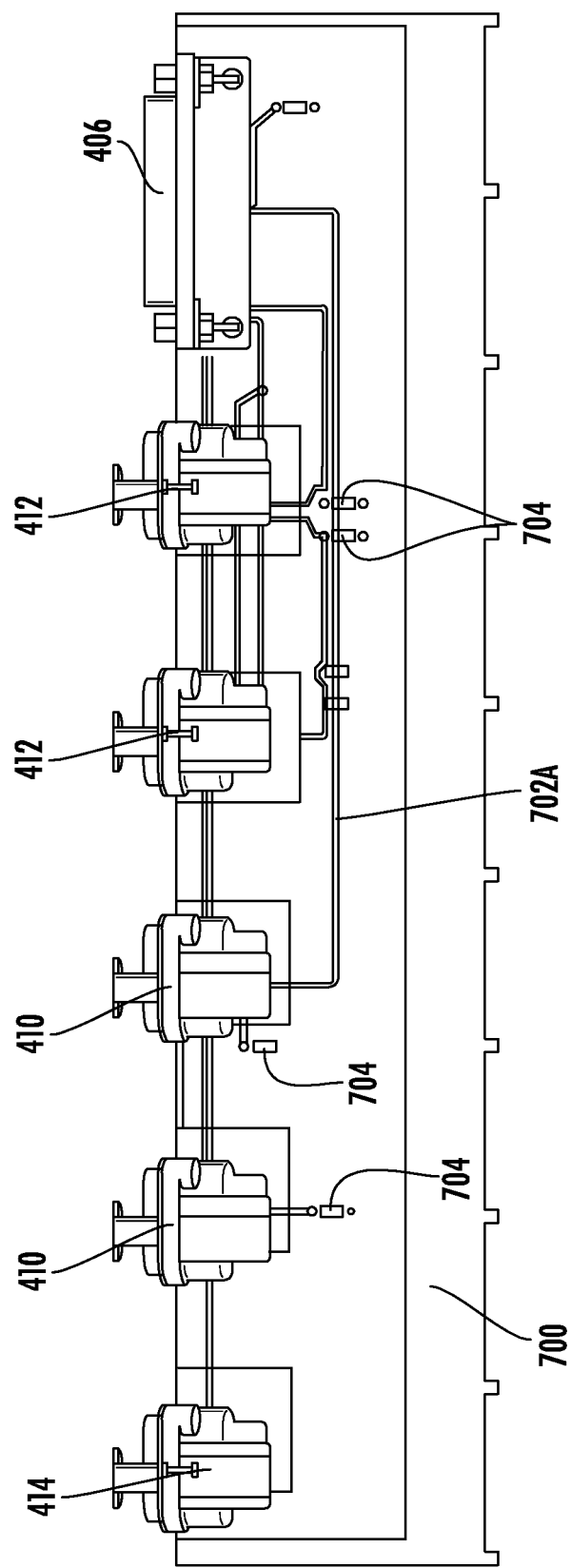
FIG. 7B is a top view of the printed circuit board and the connectors illustrated in FIG. 7A.
Figure 7C:
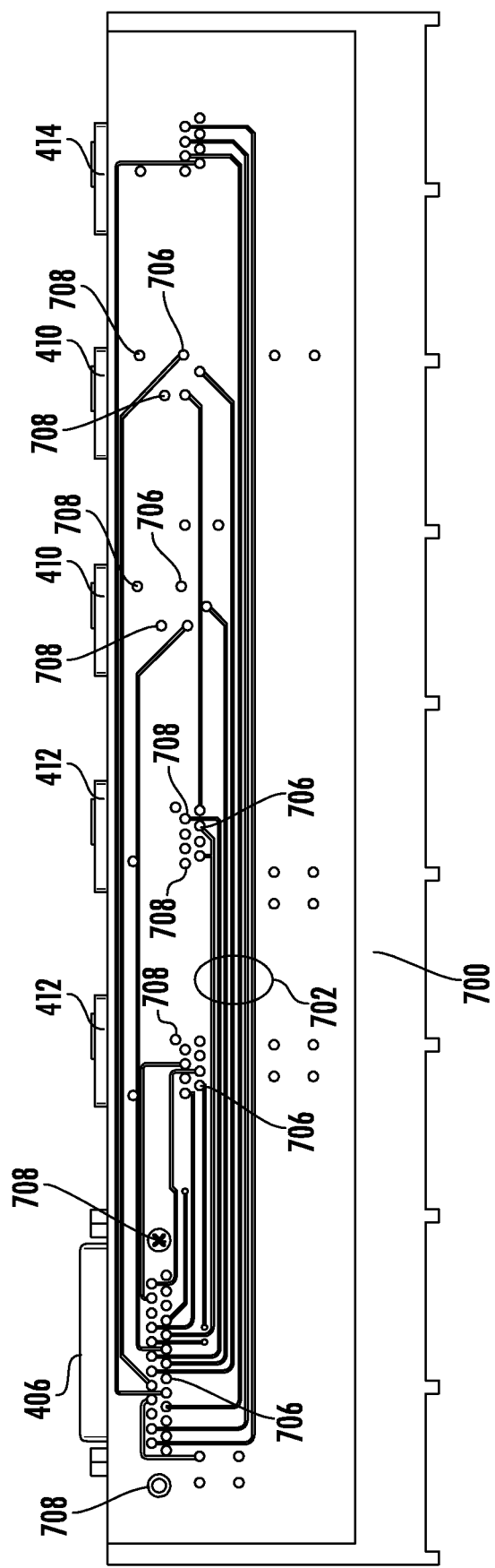
FIG. 7C is a bottom view of the printed circuit board and the connectors of FIG. 7A showing the signal traces between the connectors.

In the examples illustrated in FIGS. 4 and 5, the CCU signal breakout connectors are connected to the multi-conductor CCU connector using wires. As stated above, in an alternate implementation, the CCU signal breakout connectors may be mounted on a printed circuit board and connected to the multi-conductor CCU connector using traces on the printed circuit board. FIG. 7A-7C illustrate such an implementation. FIG. 7A is a perspective view of the printed circuit board with the multi-conductor connector and the CCU signal breakout connectors mounted thereon. In FIG. 7A, multi-conductor CCU connector 406 and CCU signal breakout connectors 410, 412, and 414 are mounted on a printed circuit board 700 and connected via traces that are printed on or in the printed circuit board.

FIG. 7B is a top view of printed circuit board 700. Some of the conductive traces are visible from the top view. The conductive traces are connected to pins of multi-conductor CCU connector 406 corresponding to the specific signal. For example, conductive trace 702A may connect one conductor of XLR connector 410 to a corresponding XLR signal pin of multi-conductor CCU connector 406. It should also be noted from the top view that printed circuit board 700 includes optional ground connections 704 for connecting predetermined CCU signals to ground. Optional ground connections 704 each a first conductive pad or via for connecting to a signal trace connected to a CCU signal, a second conductive pad or via connected to the ground plane of printed circuit board 700, and mounting space between the first and second conductive pads or vias for a resistor to be connected between a CCU signal trace and ground. The reason for ground connections 704 is so that a CCU signal can be grounded through a high impedance connection to avoid clicking or popping noises that may be caused by interference when the CCU signal is not active.

FIG. 7C is a bottom view of printed circuit board 700 illustrating signal traces 702 in more detail. In the illustrated example, multi-conductor CCU connector 406 includes signal pins 706 that extend through printed circuit board 700 and that are soldered to corresponding vias in printed circuit board 700 using pin through hole connections. Multi-conductor CCU connector 406 also includes mechanical connecting pins or tabs 708 that mechanically connect multi-conductor CCU connector 406 to printed circuit board 700. Mechanical connecting pins or tabs 708 may likewise be soldered to printed circuit board 700. Similarly, signal connectors 410, 412, and 414 also include signal pins 706 that connect to the corresponding signal pins of multi-conductor CCU connector 406 and mechanical connecting pins or tabs 708 that connect each connector to printed circuit board 700. For simplicity of illustration, not every signal pin 706 is labeled in FIG. 7C.

It can be seen from the printed circuit board design illustrated in FIG. 7A-7C that manufacturing time of the CCU communications breakout box may be greatly reduced, because the multi-conductor CCU connector and the CCU signal breakout connectors can be soldered to the printed circuit board in much less time than soldering individual wires to the connector pins in the example implementation illustrated in FIGS. 4 and 5. It should also be noted that the design in FIG. 7A-7C is smaller and lighter in weight than the design illustrated in FIGS. 4 and 5.

Figure 8A:
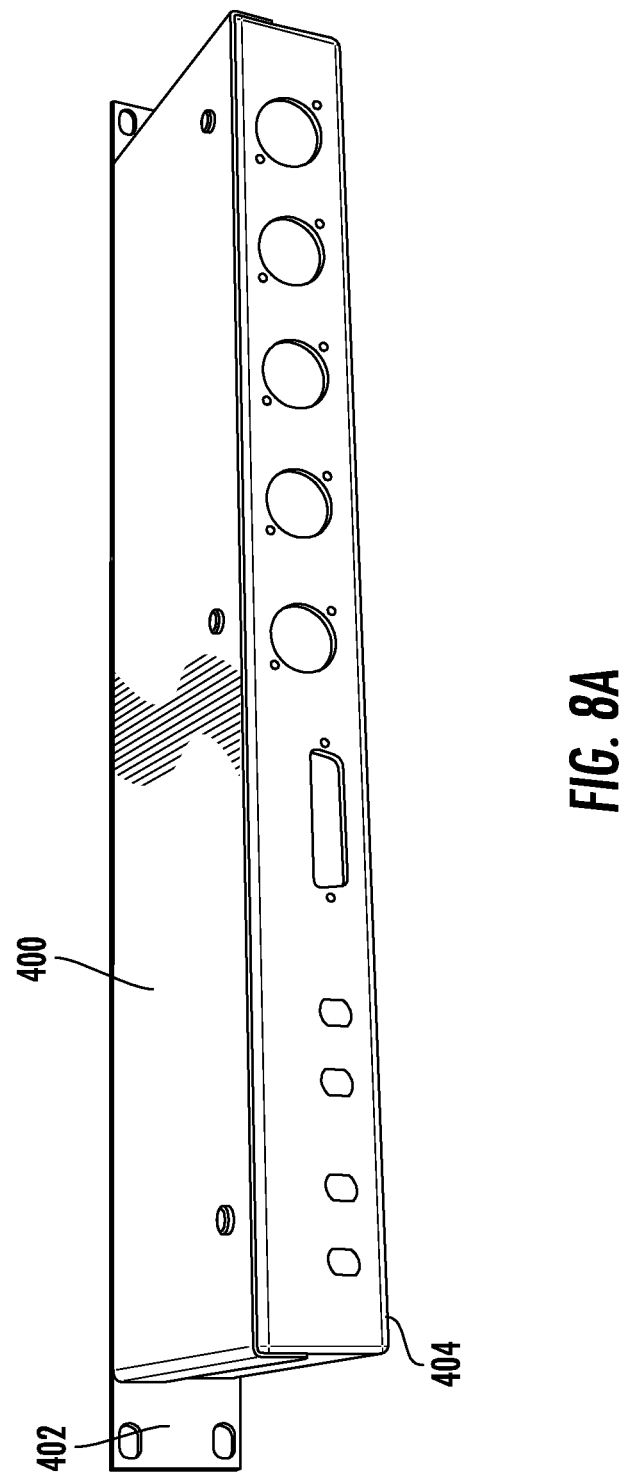
FIG. 8A is a rear perspective view of an alternate implementation of a housing for a CCU communications breakout box.
Figure 8B:
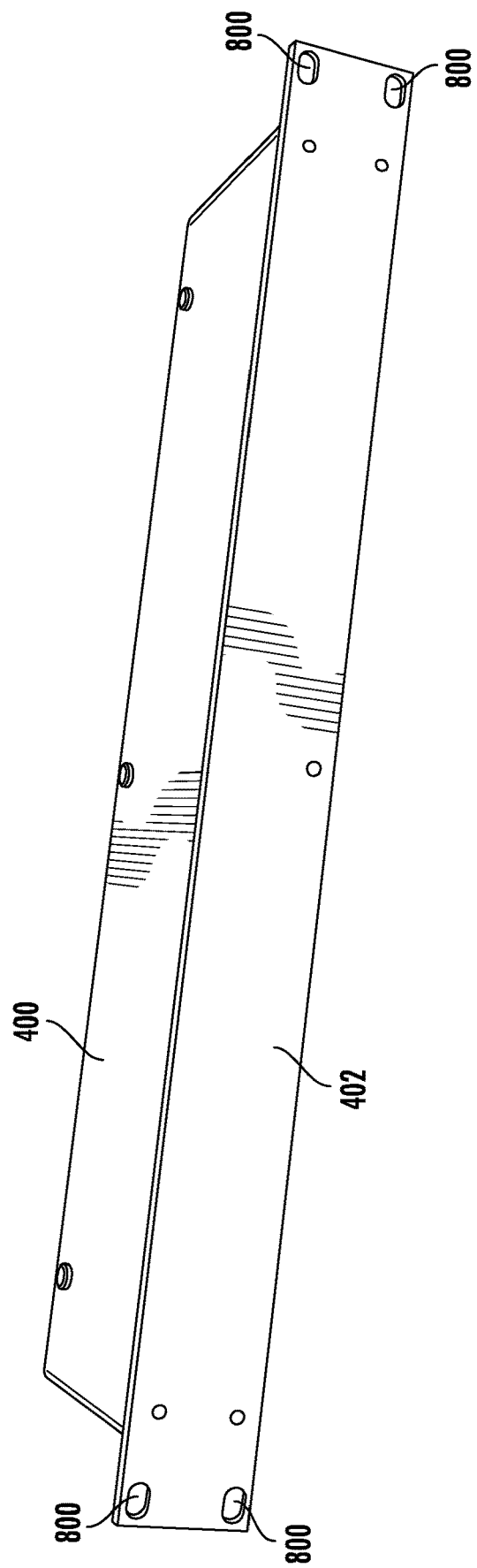
FIG. 8B is a front perspective view of the housing illustrated in FIG. 8A.

FIGS. 8A and 8B illustrate an alternate implementation of housing 400 designed to hold the printed circuit board illustrated in FIGS. 7A-7C. Referring to FIG. 8A, housing 400 houses a printed circuit board for breaking out signals of a single camera control unit. Housing 400 includes front surface 402 for mounting to an audio/visual equipment rack. Housing 400 also includes rear surface 404 including apertures for the multi-conductor CCU connector and various signal breakout connectors. FIG. 8B illustrates the front of housing 400 in more detail. In FIG. 8B, front surface 402 includes mounting holes 800 for mounting to corresponding bolts or studs in an audio/visual equipment rack.

Thus, in the example illustrated in FIGS. 7A-8B, the CCU communications breakout box includes a printed circuit board implementation that eliminates the need for soldering individual wires to break out the CCU signals from the multi-conductor CCU connector to the individual signal breakout connectors. The design is also more compact and lighter in weight than the design illustrated in FIGS. 4 and 5.

Thus, the subject matter described herein includes a CCU communications breakout box that avoids the need for external cabling to break out signals from a multi-conductor CCU connector that connects to a corresponding connector of a CCU. By placing all of the breakout connections within a rack mountable housing, the subject matter described herein decreases clutter in audio/visual control rooms. In addition, the likelihood of misconnecting cables is reduced.

What is claimed is:

1. A camera control unit (CCU) communications breakout box comprising:
 a housing for mechanically connecting to an audio/visual equipment rack;
 a printed circuit board located in the housing;
 a multi-conductor CCU connector mounted to the printed circuit board for connecting to a CCU;
 first and second audio connectors mounted to the printed circuit board and electrically connected to audio pins of the multi-conductor connector for breaking out audio signals;

first and second communications connectors mounted to the printed circuit board and electrically connected to communications pins of the multi-conductor CCU connector;

an auxiliary connector mounted to the printed circuit board and electrically connected to a signal pin of the multi-conductor CCU connector that connects to a system that controls an air indicator light on a video camera;

a plurality of conductive traces printed on the printed circuit board and connecting the first and second audio connectors to the audio pins of the multi-conductor CCU connector, the first and second communications connectors to the communications pins of the multi-conductor CCU connector, and the auxiliary connector to the signal pin of the multi-conductor CCU connector that connects to the system that controls the air indicator light on the video camera; and a plurality of ground connections comprising a first via connected to one of the signal pins of the multi-conductor CCU connector and a second via connected to a ground plane of the printed circuit board, wherein the first and second vias are spaced from each other to allow a resistor to be connected between the first and second vias.

2. The CCU communications breakout box of claim 1 wherein the housing is configured to break out signals from a single CCU.

3. The CCU communications breakout box of claim 1 wherein the housing is configured to break out signals from a plurality of CCUs.

\* \* \* \* \*